United States Patent [19]

Yaron et al.

[11] 4,305,973
[45] Dec. 15, 1981

[54] LASER ANNEALED DOUBLE CONDUCTOR STRUCTURE

[75] Inventors: Giora Yaron, Irvine; LaVerne D. Hess, Thousand Oaks, both of Calif.

[73] Assignee: Hughes Aircraft Company, Culver City, Calif.

[21] Appl. No.: 60,082

[22] Filed: Jul. 24, 1979

[51] Int. Cl.³ .................. H01L 21/31; H01L 21/316; H01L 21/268
[52] U.S. Cl. ........................ 427/35; 219/121 LM; 427/38; 427/53.1; 427/86; 427/89; 427/90; 427/93; 427/94; 427/96
[58] Field of Search ............... 219/121 LM; 427/86, 427/89, 53.1, 93, 331, 96, 35, 38, 90, 94

[56] References Cited

U.S. PATENT DOCUMENTS

| | | |
|---|---|---|
| 3,475,234 | 10/1969 | Kerwin et al. |
| 4,131,487 | 12/1978 | Pearce et al. ............... 219/121 LM |
| 4,151,008 | 4/1979 | Kirkpatrick ............... 219/121 LM |
| 4,187,126 | 2/1980 | Radd ............................ 427/86 |
| 4,198,246 | 4/1980 | Wu ............................. 427/35 |
| 4,214,918 | 7/1980 | Gat ............................ 427/53.1 |

OTHER PUBLICATIONS

Pliskin, "Comparison of Properties of Dielectric Films...", Journal of Vacuum Science Technology, vol. 14, No. 5, Sep. 10, 1977, pp. 1064–1081.

Mukai et al. "Planar Multilevel Interconnection Technology Employing a Polyimide", IEEE Journal of Solid State Circuits, vol. SC-13, No. 4, Aug. 1978, pp. 462–467.

Wu et al. "Laser Annealing of Ion Implanted Polycrystalline Silicon Films", Symposium H, Materials Research Society Annual Meeting, Boston, Mass., 12-1978.

Chatterjee et al., "A Survey . . . ", *IEEE Trans. on Electron Devices*, vol. Ed.-26, No. 6, Jun. 1979.

Ohzone et al., "A 2KX8 Bit Static Ram", IEDM Technical Digest, Int. Electron Device Meeting, Dec. 1978, pp. 360–363.

Crowder, "1 $\mu$m MOSFET . . . ", IEEE Trans. on Electron Devices, vol. Ed.-26, No. 4, Apr. 1979, pp. 369–371.

Shah, "Refractory Metal Gate Processes . . . ", IEEE Trans on Electron Devices, vol. Ed.-26, No. 4, Apr. 1979, pp. 631–640.

*Primary Examiner*—John D. Smith
*Attorney, Agent, or Firm*—Robert M. Wallace; William H. MacAllister

[57] ABSTRACT

In double conductor micro-electronic structures, prior to the low temperature deposition or growth of an insulating layer over a polycrystalline or amorphous surface, the surface is annealed using a beam of radiant energy, which causes it to become very smooth, thereby removing any surface spikes. The insulating layer placed thereover has remarkably improved insulation qualities heretofore unattainable at low temperatures. The beam of radiant energy is preferably applied in bursts of energy lasting for a sufficiently short duration so that implanted impurities in the silicon substrate do not redistribute.

27 Claims, 2 Drawing Figures

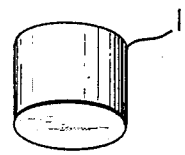
Fig. 1.
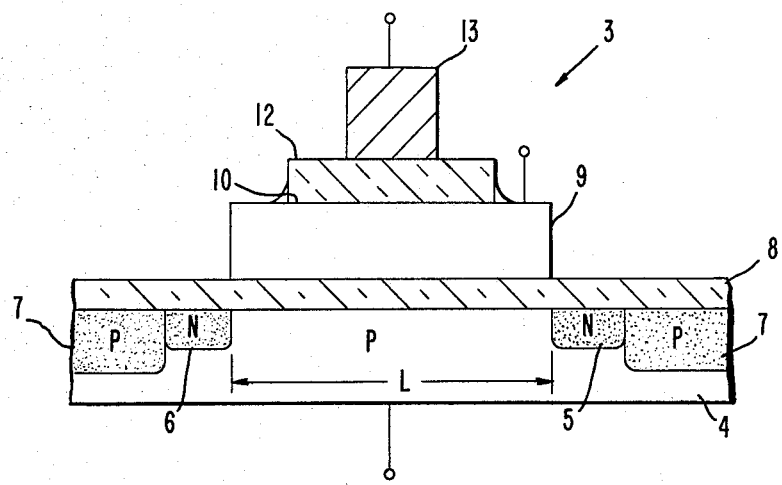
Fig. 2.
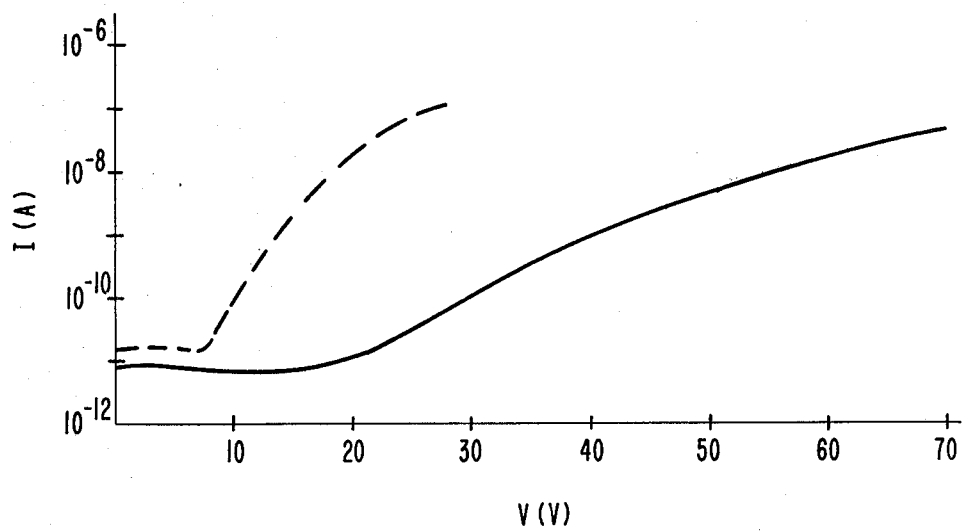

LASER ANNEALED DOUBLE CONDUCTOR STRUCTURE

TECHNICAL FIELD

This invention relates to double conductor microelectronic structures having a lower polycrystalline conductive layer, an upper conductive layer and an insulating film between the upper and lower conductive layers, in which the top surface of the lower polycrystalline conductive layer is laser annealed in order to improve the insulating characteristics of the insulating film placed thereover.

BACKGROUND ART

Double conductor microelectronic structures are typically formed by growing a first insulating film over a single crystal silicon substrate, depositing a first layer of polycrystalline conductors (such as polycrystalline silicon) over the first insulating layer, placing a second insulating film over the structure and finally depositing a second layer of conductors over the second insulating film. The purpose of the second insulating film is to insulate the first and second conductive layers from each other. Such devices perform well only if both the first and second insulating films are good insulators. The first insulating film is usually a silicon dioxide layer grown over the single crystalline silicon substrate, and is well-known to be an excellent insulator. However, a significant problem in the art is that the second insulating film placed over the polycrystalline conductive layer is only a fair insulator, resulting in relatively high leakage currents between the two conductive layers through the second insulating film. While not subscribing to any particular theory, leakage of charge through the second insulating film is believed to be caused by surface spikes in the polycrystalline conductor surface. These surface spikes are believed to cause local enhancements in the electric field, resulting in high leakage currents through the second insulating film. Regardless of the theoretical explanation for this phenomenon, there remains the significant limitation of the art that insulating films placed over polycrystalline conductive layers do not provide insulation comparable to that afforded by oxide grown over single crystalline silicon. Because the current trend in microelectronic processing is to reduce the thickness of insulating films, this problem is particularly important because reduction in insulation film thickness causes an increase in leakage current for given operation voltages.

Double conductor microelectronic structures are used in various types of devices, for example, erasable programmable read only memories (EPROMS) which use the floating gate metal oxide semiconductor technology (FAMOS). FAMOS EPROMS are well known in the art and are discussed, for example, in *Microelectronics*, by the Editors of *Scientific American*, Freeman and Company, (1977) page 59, top figure. In this type of device, leakage currents through the second insulating film cause a loss of information or charge during and after writing of information into memory.

Charge coupled devices are also a species of double conductor devices. The inferior insulation qualities of oxide grown over polycrystalline silicon is also a limiting factor in the performance of charge coupled devices. In particular, charge coupled devices of the type discussed in Sequin, et al, *Charge Coupled Devices*, Academic Press (1975) may be formed of at least two layers of polycrystalline silicon electrodes which must be insulated from one another by an intermediate layer of oxide. Leakage of charge through the intermediate oxide layer between conductors which are connected to different clock signals will severely impair device performance.

Packing density of Very Large Scale Integration (VLSI) devices such as Dynamic Random Access Memories (RAMs) and Static RAMs is improved by utilizing double conductor microelectronic structures. Therefore, the problem of leakage current through the second insulating film in double conductor devices is significant in a Dynamic and a RAM Static RAM utilizing a double conductor structure.

One possible solution to the problem of inferior insulation afforded by insulation films placed over polycrystalline layers is to grow a silicon dioxide insulation film over polycrystalline silicon material at a very high temperature (1150° C.). Although this high temperature technique is known to result in an insulating oxide film having better insulation qualtities, it still does not provide the excellent insulation afforded by oxide films grown over single crystal silicon. Furthermore, there are significant disadvantages associated with such a high temperature method. In order to achieve good insulation qualities in oxide films grown over polycrystalline material, the oxide must be grown at a high temperature of 1,150° C., causing redistribution of implanted impurities in the substrate, such as, for example, source and drain diffusions of a Metal Oxide Semi-Conductor Field Effect Transistor (MOSFET). As a result, the area over which a MOSFET gate overlaps the diffusions may increase, increasing the parasitic capacitance between the diffusions and the MOSFET gate, which reduces the speed of the MOSFET. The redistribution of the source and drain diffusions also causes changes in the channel length between the source and drain diffusions leading to uncontrollable punch through currents.

A further disadvantage of high temperature deposition of oxide films over polycrystalline material is that the resulting device is more susceptible to change in electrical characteristics due to ionizing radiation damage from gamma rays and x-rays. As a result, devices having oxide layers grown at the high temperatures discussed above will not meet the radiation hardness requirements of military specifications.

In summary, the inferior insulation provided by oxide layers grown over polycrystalline silicon conductors is a problem limiting device performance which could be partially solved in the prior art only by using a high temperature oxidation process which degrades the device characteristics.

SUMMARY OF THE INVENTION

The foregoing limitations of the prior art are completely overcome in the present invention in which double conductor microelectronic devices are fabricated having an insulating film placed over a polycrystalline conductive layer which has been laser annealed so that the insulating film exhibits excellent insulation qualtities without the use of the high temperature process discussed previously. In a particular embodiment of the invention, a polycrystalline conductor is annealed using a ruby laser beam prior to the growth of an insulating film. The laser beam causes the polycrystalline surface to become very smooth, thereby reducing nonuniformities or spikes in that surface. The laser beam is preferably applied in bursts of energy lasting for a sufficiently short duration so that implanted impurities in the substrate, such as channel stops, field implants or diffusions, do not redistribute, but instead maintain their original configuration and definition, thereby leaving all device characteristics intact. Thereafter, the overlying insulating film is grown at low temperature (925° Celsius) over the polycrystalline layer. The resulting insulating film provides insulation comparable to that afforded by oxide films grown at high temperatures (1150° C.) over polycrystalline silicon and may even afford superior insulation. In the presently preferred mode of the invention, the polycrystalline film is exposed to a short burst of 20 nanoseconds of light from a ruby laser at an energy density of about one joule/cm$^2$ prior to the deposition of the overlying oxide film. The 20 nanosecond period is of sufficiently short duration to ensure that there will be no redistribution of implanted impurities in the underlying substrate. Capacitance/voltage tests of the type well known in the art have been conducted which indicate that the laser beam does not substantially alter the surface characteristics of the underlying silicon substrate.

The leakage current through insulating films placed over polycrystalline conductors is dramatically reduced in this invention by a factor of a thousand or more, which has been proven by test results, providing a revolutionary advance in the art.

The use of the invention is not limited to any particular materials, but includes any double conductor structure in which the lower conductive layer is an amorphous or polycrystalline material such as aluminum, polycrystalline silicon, polycide, metal silicide or refractory metal, as described in publications referred to below in the Detailed Description. Furthermore, the insulating film overlying the lower level polycrystalline conductor may be any suitable dielectric, including silicon dioxide, silicon nitride or polyimide as also described in publications referred to below in the Detailed Description.

BRIEF DESCRIPTION OF THE DRAWINGS

The invention will be best understood by reference to the accompanying drawings of which:

FIG. 1 is a simplified cross-sectional view of a portion of an exemplary double conductor microelectronic device showing the application of a beam of radiant energy according to the method of the present invention; and FIG. 2 is a plot of data representing the insulation characteristics of the oxide layer overlying the polycrystalline silicon layer of FIG. 1.

DETAILED DESCRIPTION OF THE INVENTION

FIG. 1 is illustrative of the method of this invention in which a radiant energy beam source 1 directs a beam of radiant energy 2 at a double conductor structure 3 during fabrication. For the sake of example only, the structure 3 illustrated in FIG. 1 is of the specific type disclosed in *Microelectronics,* Editors of *Scientific American,* Freeman and Company, (1977) page 59, and is useful as a FAMOS EPROM memory cell. However, it should be recognized that the invention is intended for use with any double conductor structure, such as a CCD, a dynamic RAM or a static RAM having two conductive layers separated by a dielectric, in which the lower level conductor is a polycrystalline material.

The double conductor structure 3 includes a single crystalline silicon substrate 4 of P-type conductivity, preferably grown to have a single-crystal orientation of silicon 100. N-type conductivity source and drain regions 5 and 6 separated by channel length L and a P-type field region 7 may be formed in the substrate 4 by ion implantation. A first insulating film 8, which may be silicon dioxide, is grown over the top surface of the substrate 4. A gate 9 formed of polycrystalline or amorphous material is deposited over the first oxide layer 8 and is positioned between the two diffusions 5 and 6. The top surface 10 of the polycrystalline gate 9 may have surface spikes which are removed or reduced when exposed to the energy beam 2. Thereafter, a second insulating film 12 is grown or deposited over the polycrystalline gate 9 at a relatively low temperature (925° C.), and provides improved insulation by reason of the previous application of the energy beam 2 to the underlying polycrystalline surface 10. A top conductor 13 is deposited over the second insulating film 12.

Significantly, the method of this invention is intended for use with all double conductor microelectronic devices in which the lower conductive layer is any amorphous material. It should be recognized that the double conductor layers 9 and 13 of FIG. 1 separated by the insulating film 12 are typical of all double conductor structures in which the lower level conductor 9 is any polycrystalline conductive material and the intervening insulating film 12 is any suitable dielectric film. Such double conductor microelectronic devices include Charge Coupled Devices (CCD's) having two (or more) conductive layers, dynamic Random Access Memories (RAM's) of the type disclosed in Chatterjee et al, "A Survey of High Density Dynamic RAM Cell Concepts", *IEEE Trans. on Electron Devices,* Vol. Ed-26, No. 6, June 1979, pages 827–839, and static Random Access Memories of the type disclosed in Ohzone et al, "A 2K×8 Bit Static Ram", *IEDM Technical Digest, International Electron Device Meeting,* Dec. 4–6, 1978, Washington D. C., pages 360–363, paper no. 14.7 (Electron Device Society of the *IEEE*).

The first conductive layer 9 may be aluminum or any polycrystalline or amorphous material, such as polycrystalline silicon or it may be polycide or metal silicide of the type disclosed in Crowder et. al, "1μm MOSFET VLSI Technology: Part VII Metal Silicide Interconnection Technology—A Future Prospective", *IEEE Trans. on Electron Devices,* Vol. Ed.-26 No. 4, April 1979, Pages 369–371. Alternatively, the conductive layer 9 may also be a refractory metal layer of the type disclosed in Shah, "Refractory Metal Gate Processes for VLSI Applications", *IEEE Trans. on Electron Devices,* Vol. ED-26, No. 4, Apr. 1979, pp. 631–640.

The intervening insulating layer 12 may be grown or deposited silicon dioxide (SiO$_2$) or silicon nitride (Si$_3$N$_4$) of the type disclosed in Pliskin, "Comparison of Properties of Dielectric Films Deposited by Various Methods", *Journal of Vacuum Science Technology,* Vol. 14, No. 5, September/October 1977, pp. 1064–1081. Alternatively, the intervening insulating layer 12 may be a polyimide layer of the type disclosed in Mukai et al, "Planar Multilevel Interconnection Technology Employing a Polyimide", *IEEE Journal of Solid State Circuits,* Vol. SC-13, No. 4, August 1978, pp. 462–467. The disclosures of the above-identified Chatterjee, Ohzone, Crowder, Shah, Pliskin and Mukai publications are hereby expressly incorporated herein by reference in their entirety.

In the preferred method of the invention, the polycrystalline surface 10 is exposed to radiation from a Q-switched ruby laser emitting radiation having a wavelength of 6943 Å in pulses having a duration of about 20 nanoseconds, with a beam diameter of approximately 6 millimeters and an energy density of about one joule/$CM^2$. Advantageously, in the specific example of FIG. 1, the short pulse duration of 20 nanoseconds prevents any significant redistribution of implanted impurities such as the diffusions 5 and 6 and of the field implant 7 which would otherwise reduce the channel length L, permitting uncontrolled minority carrier punch through between the diffusions 5 and 6. After the application of the ruby laser beam, the insulating film 12 is grown or deposited at a sufficiently low temperature to avoid significant redistribution of the source and drain diffusions 5 and 6 and the field implant 7.

The laser annealing method of this invention was tested on a double conductor test structure similar to the double conductor structure 3 of FIG. 1, but having an N-type substrate 4 and having no diffused regions 5, 6 or 7. To perform the test, a first layer 8 of silicon dioxide was grown over the substrate 4 and then a layer of polycrystalline silicon 9 was deposited thereover. A laser beam was applied to the polysilicon surface 10 according to the above-described preferred method of the invention. Thereafter, overlying layers of silicon dioxide 12 and aluminum 13 were grown and deposited respectively. No measureable change in surface characteristics of the underlying substrate surface was caused by the laser radiation. This was verified by plotting the capacitance between the silicon substrate 4 and the polycrystalline electrode 9 as a function of applied voltage on the aluminum conductor 13 and observing that there were no significant differences in the capacitance/voltage data between devices made with and without the method of this invention.

FIG. 2 is a plot of data obtained from the above-described test structure representing the current flow measured between the floating gate 9 and the top electrode 13 as a function of a positive voltage applied to the top electrode 13 with respect to the substrate 4. The voltage is plotted on the abscissa while the current is plotted on the ordinate. The curve shown in solid line illustrates the data plotted for a device fabricated using the preferred laser annealing method of this invention. The curve shown in dotted line illustrates data obtained from a similar device fabricated without the use of the laser annealing method of this invention. Again, testing was conducted on a structure similar to the structure 3 illustrated in FIG. 1 with the difference that the silicon substrate 4 was of N-type conductivity and the source and drain diffusions in 5 and 6 and field implant 7 were absent. FIG. 2 shows that the leakage current in the device fabricated using the laser annealing method of this invention is radically lower with respect to the prior art, and in fact is an improvement of over three orders of magnitude at an applied voltage of approximately 20 volts.

It should be understood that, while the radiant energy beam source of this invention has been described as a pulsed ruby laser, any pulsed or continuous radiant energy beam source may be used in place of a source 1 of FIG. 1, such as a pulsed electron beam or ion beam source, or a continuous laser, electron or ion beam source which is rapidly scanned across the device surface, although these sources have not been tested at the present time. The continuous beam source should preferably be scanned at a sufficiently high scan rate to prevent excessive heat build-up in the underlying substrate.

The problem solved by this invention is to grow at a low temperature (925° C.) an oxide layer over polycrystalline silicon which has insulation qualities equivalent to those afforded by oxide grown over polycrystalline silicon at a high temperature (1150° C.). Significantly, it has been found that the laser annealing method of this invention may afford insulation qualities in oxide grown at low temperatures over polycrystalline silicon which are equal to or even superior to the insulation qualities obtained at the higher temperatures, while avoiding the problem of high temperature redistribution of dopant impurities in the substrate and degradation of the radiation hardening properties of the device.

What is claimed is:

1. A method for growing improved oxide over a polycrystalline silicon layer overlying a silicon substrate, said substrate having dopant impurities, comprising:
   depositing a polycrystalline silicon layer over said substrate;
   exposing said polycrystalline silicon layer to a beam of energy of sufficient magnitude to cause removal of surface defects in said polycrystalline silicon layer, said energy beam being of sufficiently short duration to prevent substantial redistribution of said impurities; and,
   growing silicon dioxide over said polycrystalline silicon layer at a sufficiently low temperature to prevent substantial redistribution of said impurities, said silicon dioxide having a susceptibility to leakage current therethrough which is reduced in proportion to the previous removal of said surface defects by said exposing step.

2. The method of claim 1 further comprising initially growing a lower layer of silicon dioxide on said silicon substrate before said depositing step.

3. The method of claims 1 or 2 wherein said exposing step comprises directing a pulsed laser beam having a pulse duration of less than 100 nanoseconds at said polycrystalline silicon layer.

4. The method of claim 3 wherein said exposing step comprises directing a pulsed ruby laser beam at said polycrystalline silicon layer, said beam having a wavelength of approximately 6943 angstroms, an energy density of approximately one joule/$cm^2$, a beam diameter of approximately 6 millimeters and a pulse duration of approximately 20 nanoseconds.

5. A method for fabricating a metal oxide semiconductor device having a polycrystalline silicon layer and a conductor overlying said layer, said device having improved insulation between said polycrystalline silicon layer and said overlying conductor, comprising:
   forming a layer of polycrystalline silicon;
   exposing said polycrystalline silicon layer to a beam of energy of sufficient magnitude to smooth surface defects in said polycrystalline silicon layer;
   growing a film of silicon dioxide over said polycrystalline silicon layer at a sufficiently low temperature to prevent substantial thermal changes in said metal oxide semiconductor device, said silicon dioxide film having a susceptibility to leakage currents therethrough which is reduced in proportion to the previous smoothing of said surface defects by said exposing step; and depositing a conductor on said silicon dioxide layer, said conductor overlying said polycrystalline silicon layer.

6. A method for placing improved insulation over a material layer overlying a substrate wherein said material layer comprises one of an amorphous material and a polycrystalline material, said method comprising:
first placing said material layer over said substrate;
exposing said material layer to a beam of energy of sufficient magnitude to smooth surface defects in said material layer;
second placing an insulating film over said material layer at a sufficiently low temperature to prevent substantial thermal changes in said substrate, said insulating film having a susceptibility to leakage currents therethrough which is reduced in proportion to the previous smoothing of said surface defects by said exposing step; and
third placing a conductor layer over said insulating film.

7. The method of claim 6 further comprising initially growing a lower layer of silicon dioxide on said silicon substrate before said first placing step.

8. The method of claim 6 wherein said exposing step comprises directing a pulsed laser beam having a pulse duration of less than 100 nanoseconds at said material layer.

9. The method of claim 8 wherein said exposing step comprises directing a pulsed ruby laser beam at said material layer, said beam having a wavelength of approximately 6943 angstroms, an energy density of approximately one joule/cm$^2$, a beam diameter of approximately 6 millimeters and a pulse duration of approximately 20 nanoseconds.

10. The method of claims 6, 7, 8 or 9 wherein at least one of said first and third placing steps comprises depositing a layer of polycrystalline silicon.

11. The method of claims 6, 7, 8 or 9 wherein at least one of said first and third placing steps comprises depositing a layer of polycide.

12. The method of claims 6, 7, 8 or 9 wherein at least one of said first and third placing steps comprises depositing a layer of metal silicide.

13. The method of claims 6, 7, 8 or 9 wherein at least one of said first and third placing steps comprises depositing a refractory metal layer.

14. The method of claims 6, 7, 8 or 9 wherein said second placing step comprises depositing a layer of silicon dioxide.

15. The method of claims 6, 7, 8 or 9 wherein said second placing step comprises growing a layer of silicon dioxide.

16. The method of claims 6, 7, 8 or 9 wherein said second placing step comprises depositing a layer of silicon nitride.

17. The method of claims 6, 7, 8 or 9 wherein said second placing step comprises depositing a layer of polymide.

18. The method of claims 6, 7, 8 or 9 wherein at least one of said first and third placing steps comprises depositing an aluminum layer.

19. The method of claims 6, 7, 8 or 9 further comprising depositing an aluminum layer over said insulating film after said second placing step.

20. The method of claim 6 wherein said exposing step comprises directing a pulsed electron beam source at said material layer.

21. The method of claim 6 wherein said exposing step comprises directing a continuous electron beam source at said material layer and scanning said beam across said material layer.

22. The method of claim 6 wherein said exposing step comprises directing a pulsed ion beam source at said material layer.

23. The method of claim 6 wherein said exposing step comprises directing a continuous ion beam source at said material layer and scanning said beam across said material layer.

24. The method of claim 6 wherein said exposing step comprises directing a scanning continuous laser beam at said material layer.

25. The method of claims 6, 7, 8 or 9 wherein said second placing step comprises growing an insulating layer over said material layer at a temperature sufficiently low so as to avoid substantially altering the radiation hardness of said substrate.

26. A method for placing improved insulation over an amorphous material overlying a substrate, comprising:
first placing an amorphous material layer over said substrate;
exposing said amorphous material layer to a beam of energy of sufficient magnitude to cause removal of surface defects in said amorphous layer; and
second placing an insulating film over said amorphous material layer at a sufficiently low temperature so as to prevent thermal changes from occurring in said substrate during said second placing step, said insulating film having a susceptibility to leakage currents which is reduced in proportion to said removal of said surface defects by said exposing step.

27. A method for placing improved insulation over a polycrystalline material overlying a substrate, comprising:
first placing a polycrystalline material layer over said substrate;
exposing said polycrystalline material layer to a beam of energy of sufficient magnitude to cause removal of surface defects in said polycrystalline material layer; and
second placing an insulating film over said polycrystalline material layer at a temperature sufficiently low so as to substantially prevent thermal changes in said substrate during said second placing step, said insulating film having a susceptibility to leakage currents which is reduced in proportion to said removal of said surface defects by said exposing step.

* * * * *